United States Patent [19]

Maxim et al.

[11] Patent Number: 6,087,733
[45] Date of Patent: Jul. 11, 2000

[54] SACRIFICIAL EROSION CONTROL FEATURES FOR CHEMICAL-MECHANICAL POLISHING PROCESS

[75] Inventors: Michael A. Maxim, San Jose; Michael Kocsis, Santa Clara; Ning Hsieh, Cupertino, all of Calif.; Matthew Prince; Kenneth C. Cadien, both of Portland, Oreg.

[73] Assignee: Intel Corporation, Santa Clara, Calif.

[21] Appl. No.: 09/094,541

[22] Filed: Jun. 12, 1998

[51] Int. Cl.[7] .................... H01L 23/544; H01L 21/76; H01L 21/301; H01L 21/302
[52] U.S. Cl. ................... 257/797; 257/620; 257/48; 438/401; 438/462; 438/692
[58] Field of Search ............................ 257/48, 797, 620; 438/401, 462, 690–692

[56] References Cited

U.S. PATENT DOCUMENTS

| | | |
|---|---|---|
| 3,825,442 | 7/1974 | Moore . |
| 4,775,550 | 10/1988 | Chu et al. . |
| 5,264,387 | 11/1993 | Beyer et al. ............................ 438/404 |
| 5,278,105 | 1/1994 | Eden et al. . |
| 5,554,064 | 9/1996 | Breivogel et al. ........................ 451/41 |
| 5,635,083 | 6/1997 | Breivogel et al. ........................ 216/88 |
| 5,885,856 | 3/1999 | Gilbert et al. ........................... 438/129 |
| 5,889,335 | 3/1999 | Kuroi et al. ............................. 257/797 |
| 5,933,744 | 8/1999 | Chen et al. .............................. 438/401 |
| 5,965,941 | 10/1999 | Weling et al. ........................... 257/758 |

OTHER PUBLICATIONS

"A CMP Compatible Alignment Strategy," Rouchouze, Darracq and Gemen, *SPIE vol. 3050,* beginning at p. 282, Apr. 1997.
"Pattern Density Effects in Tungsten CMP," Rutten, Feeney, Cheek and Landers, *1995 ISMIC,* beginning at p. 419, Jun. 1995.
"CMP Overlay Metrology: Robust Performance Through Signal and Noise Improvements," Podlesny, Cusack and Redmond, *SPIE vol. 3050,* beginning at p. 293, Apr. 1997.
"Effect of Processing on the Overlay Performance of a Wafer Stepper," Dirksen, et al., *SPIE vol. 3050,* beginning at p. 102; see Figure 10 on p. 110, Apr. 1997.

*Primary Examiner*—David Hardy
*Assistant Examiner*—Allan R. Wilson
*Attorney, Agent, or Firm*—Blakely, Sokoloff, Taylor & Zafman LLP

[57] ABSTRACT

A method and apparatus for compensating for the effects of nonuniform planarization in chemical-mechanical polishing (CMP) such as the erosion occurring from the removal of titanium nitride/tungsten films is disclosed. In the context of alignment marks, dummy marks are disposed on both sides of the actual alignment marks providing a similar feature density as the alignment marks. During the CMP, the dummy marks reside in the area of nonuniform erosion, leaving the actual marks in an area of uniform erosion. The present invention may also be used to control underlayer erosion variations in the high feature density device areas adjacent to the low feature density open areas by providing dummy features in the low feature density areas.

3 Claims, 4 Drawing Sheets

DISHING PROFILE AT TRANSITION

SACRIFICIAL EROSION CONTROL FEATURES FOR CHEMICAL-MECHANICAL POLISHING PROCESS

BACKGROUND OF THE INVENTION

1. Field of the Invention.

The invention relates to the field of the chemical-mechanical polishing of semiconductor wafers.

2. Prior Art and Related Art.

In semiconductor processing rough or undulation layers, or abrupt changes in contours are avoided. These layers and contours can cause high stress, cracking and electromigration in metal layers, and optical aberrations, among other problems.

One early technique for eliminating the abrupt contours in a glass layer resulting from etching contact openings was to reflow the glass layer as taught by U.S. Pat. No. 3,825,442. Numerous planarization methods are also used on entire layers such as chemically etching-back an interlayer dielectric (ILD) as taught in U.S. Pat. No. 4,775,550. More recently, chemical-mechanical polishing (CMP) has been used for planarization, such as shown in U.S. Pat. Nos. 5,554,064 and 5,635,083. Another technique used to promote planarized surfaces is the fabrication of dummy features to, for example, provide more uniformed etching and deposition over the entire wafer, as discussed in U.S. Pat. No. 5,278,105.

A problem resulting from CMP is erosion of the underlayer, and is sometimes known as "dishing". Control of the uniformity and variability of dishing addressed by the present invention. An example of dishing is shown in the cross-sectional elevation view of a pair of alignment marks 10 of FIG. 1. Often during the fabrication of integrated circuits, alignment marks are fabricated in the scribe lines lying between the dies of a wafer. In some cases marks are elongated trenches fabricated in one layer of the integrated circuit to provide optical alignment for the next layer of the circuit. In FIG. 1, the example shown illustrates a pair of parallel tungsten filled trenches 10 separated by a predetermined distance. The trenches are formed in an ILD 12 such as a chemical vapor deposited, silicon dioxide (oxide) layer. The marks 10 are formed simultaneously with the fabrication of tungsten plugs of the integrated circuits in the device areas. In general the process for forming these plugs includes, following the deposition of the ILD 12, the etching of openings (vias) in the die area simultaneously with the etching of the trenches for the marks 10, the deposition of an adhesion layer 14 such as titanium nitride (TiN), and the deposition of the plug material such as tungsten. Then the tungsten and TiN layers are polished back using CMP leaving only the plugs.

As shown in FIG. 1 a nonuniform dish 15 results at the marks caused by erosion of the ILD in the proximity to the marks. This non-uniform and non-symmetric dishing is due to something sometimes referred to as the proximity effect since it results at the edge of features and is influenced by the surrounding features. Another effect, sometimes referred to as the rotational effect, describes an asymmetric erosion demonstrated in FIG. 1 by the fact that the leading edge 16 is sloped differently than the trailing edge 17 of the dish 15. This effect is particularly troublesome since alignment for the subsequent layer is made to the outer edges of the marks and the asymmetric slopes cause misalignment. This problem has been recognized, see for example, "Pattern Density Effects in Tungsten CMP," Rutten, Feeney, Cheek and Landers, 1995 *ISMIC*, beginning at page 419 and "CMP Overlay Metrology: Robust Performance Through Signal and Noise Improvements," Podlesny, Cusack and Redmond, *SPIE* Vol.8050, beginning at page 293.

One approach to the dishing problem is to segment each of the marks into a plurality of segments such as shown in "Effect of Processing on the Overlay Performance of a Wafer Stepper,"Dirksen, et al., *SPIE* Vol. 3050, beginning at page 102; see FIG. 10 on page 110. Additionally, this is discussed in "A CMP Compatible Alignment Strategy," Rouchouze, Darracq and Gemen, *SPIE* Vol. 3050, beginning at page 282.

The dishing from the CMP also occurs at the transition between the low feature density and the high feature density die areas. This is shown in FIG. 2 where feature height is plotted against horizontal distance with line 20 being the demarcation between a low density "open" area and the high density device structure. As can be seen from FIG. 2, the first several hundred microns of the device for one process has relatively high variation in heights at the transition from low to high feature density following the CMP. The dishing depth returns to an equilibrium depth further from the transition zone. These depth variations can cause portions of a subsequently formed photoresist layer to be out of the focus plane during patterning.

SUMMARY OF THE INVENTION

A semiconductor wafer is disclosed having a first feature on the wafer formed, in part, by chemical-mechanical polishing (CMP). A dummy feature is formed, in part, by the CMP simultaneously with the formation of the first feature on at least one side of the first feature. The dummy feature typically has approximately the same or greater feature density as the first feature and is positioned such that its structure is partly sacrificed to the nonuniform or non-symmetric erosion during the CMP so as to protect the first feature from these variations.

DETAILED DESCRIPTION OF THE PRESENT INVENTION

A method and apparatus for reducing the affects of erosion that occur during chemical-mechanical polishing (CMP)

sometimes referred to as "dishing" is described. In the following description numerous specific details such as specific features, feature heights, feature densities, etc., are set forth to provide a thorough understanding of the present invention. It will be apparent that these specific details are not required to practice the present invention. In other instances, well-known steps, such as the deposition of well-known layers and lithography steps, well-known in the art, are not described in detail in order not to obscure the present invention.

Present Invention In Connection With Alignment Marks

Figure 1:
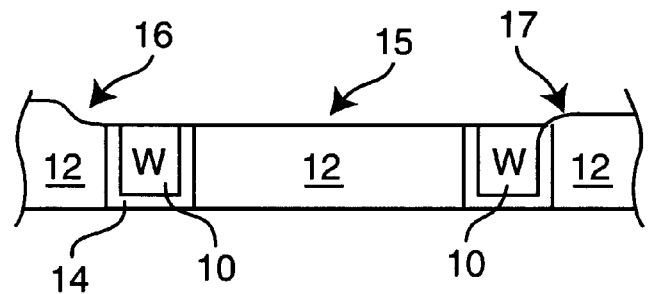
FIG. 1 is the cross-sectional elevation view of a wafer illustrating a pair of alignment marks.

One application for the present invention is in connection with alignment marks such as the alignment marks shown in FIG. 1. In the following description tungsten filled trenches forming alignment marks are described. The present invention, however, may be used with other marks, formed in other layers or in the substrate and, as will be described, for integrated circuit features other than marks.

Figure 3:
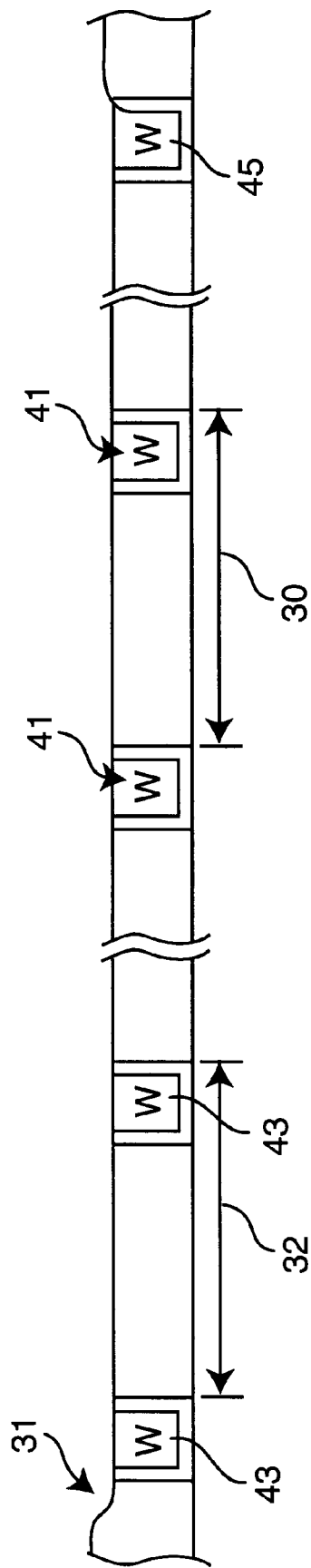
FIG. 3 is the cross-sectional elevation view of a wafer illustrating the use of the present invention in connection with alignment marks.
Figure 4:
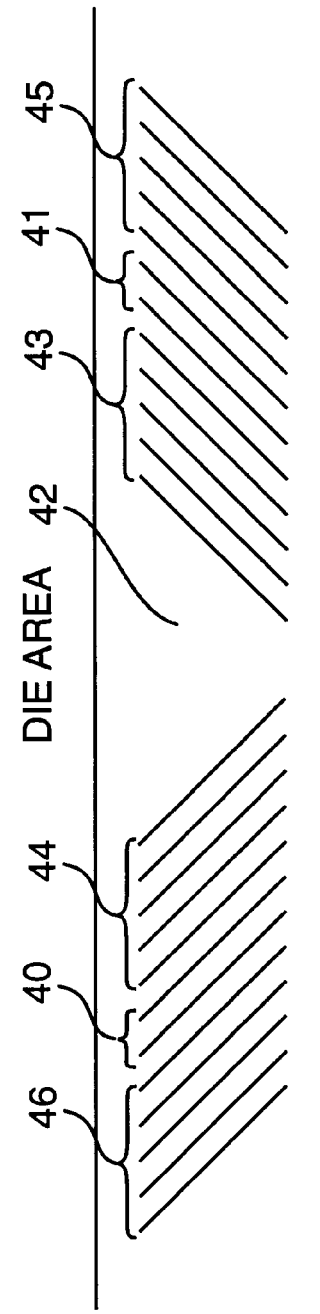
FIG. 4 is a plan view of a portion of a scribe line illustrating the present invention when used in connection with alignment marks.

In FIG. 4 a scribe line 42 is illustrated which includes two pairs of marks 40 and 41. These marks may be similar to the marks shown in FIG. 1. Each pair of marks comprises tungsten filled trenches formed in an ILD. Typically, for each layer there are orthogonal marks distributed over the wafer for aligning the step and repeat exposures used in semiconductor lithography. With the present invention, a plurality of additional "dummy" second features are fabricated adjacent to the pair of first marks. This is illustrated in FIG. 3 by the five dummy marks 45 disposed on the right side of the actual marks 41 and the five dummy marks 43 disposed on the left side of the actual marks 41. Similarly, there are dummy marks 44 and 46 disposed on the opposite sides of the actual marks 40. The dummy marks 44 ideally are fabricated with the same feature density as the actual marks 40 and 41, and consequently, there will be no feature density transition between the dummy marks and the actual alignment marks. As will be seen the dummy marks are "sacrificial" in that part of their structure is altered or destroyed during the CMP to protect the actual marks 40 and 41.

In the cross-sectional view of FIG. 4 the actual marks and some of the dummy marks from FIG. 3 are illustrated. The actual marks 41 are shown having the pitch 30 with the dummy marks disposed on both sides of the actual marks. (Only two dummy marks 43 and one dummy mark 45 of FIG. 4 are illustrated in FIG. 3 since it is inconvenient to show more without a much larger drawing.) The dummy marks and the actual marks have similar feature densities and are both fabricated simultaneously with the plugs in the die areas.

As mentioned, ideally the feature density of the dummy features should be the same as the actual alignment marks. This can be done with several different schemes, by using features of various sizes, shapes, and pitches to meet the density requirements. It has been found that one of the most effective ways to meet the feature density requirements is to make the dummy features the same dimensions and pitch as the actual alignment marks. However, it may not always be possible to provide the same pitch In some automatic alignment equipment the aligner looks for a predetermined pitch such as 9 microns. Thus the pitch 30 for the actual marks 41 is 9 microns. If the pitch of the dummy marks is also 9 microns, the aligner may align with a pair of dummy marks 43 or 45 of FIG. 3. This will cause an error in alignment since the wrong marks are chosen. In one embodiment of the present invention, the dummy marks have a pitch 32 of 8 microns, that is there is a one micron difference between the pitch of the actual marks and the dummy marks. Some makes and models of aligners will ignore the marks with 8 micron pitch and only align to the pair of actual marks with the 9 micron pitch. In practice the difference in pitch, and hence the difference in feature density, between the dummy marks and the actual marks should be kept as small as possible but yet large enough so that an automatic aligner will not align to the dummy features.

For the embodiment of FIG. 4 five dummy marks are shown on each side of the actual marks. The width of the dummification and hence in this case the number of dummy marks used, will depend upon the particular process, and particularly on the details of the CMP. The dummification width needed for a particular process may be determined empirically. This may be done for instance, by fabricating a wide area of dummified features of the appropriate feature density. Following CMP, the amount of erosion for each of the dummy marks can be determined with a profilometer or AFM as a function of distance from the edge of the dummified area. This is shown in FIG. 8 where mark erosion is plotted for several dummy marks starting with the mark on the right edge of the dummified area.

The segment 81 indicates the depth at the edge of the feature density transition zone such as illustrated by the slope 31 of FIG. 3. As can be noted from FIG. 8, the segments 82 and 83 representing the first two marks, have very noticeably different amounts of erosion than segment 84, and consequently, aligning to marks represented by the segments 82 and 83, or 83 and 84 would result in an alignment error. By segment 85 however, the amount of erosion begins to be relatively constant, that is an equilibrium is reached from about the fourth or fifth mark. Consequently, selecting five dummy marks on each side of the actual marks assures for this particular process that the pair of actual marks will be uniform. The number of dummy marks needed may vary from layer-to-layer as well as process-to-process. Also, the measurement shown in FIG. 8 is preferably made at several places on a wafer to assure that the number of dummy marks selected is great enough to provide equilibrium over the entire wafer.

Figure 8:
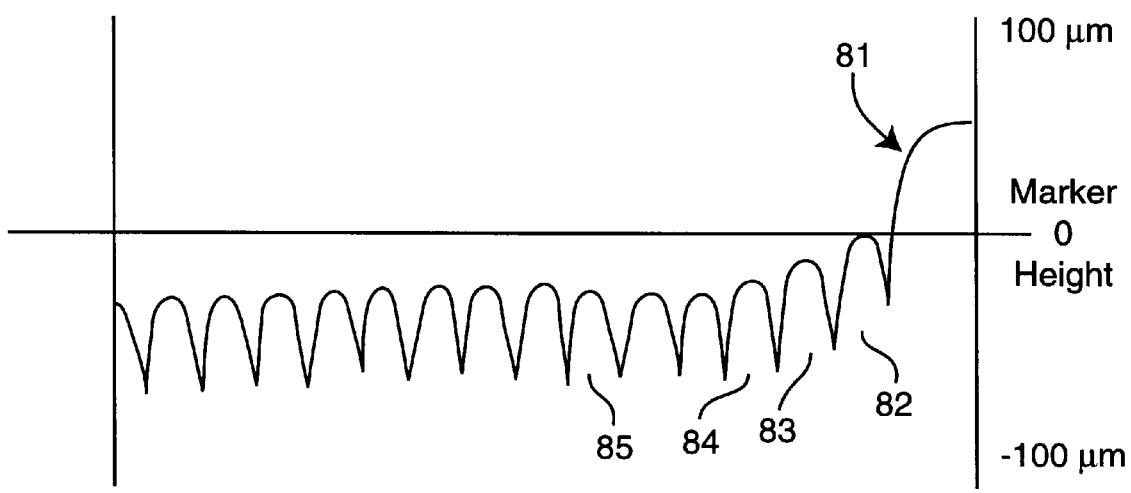
FIG. 8 is a graph illustrating the variation in feature heights of dummy features and alignment marks following CMP with the improvement of the present invention.

As is apparent from FIG. 8, the dummy features at the edge of the dish reside in a region of the wafer having nonuniform erosion, whereas the actual marks are in an area of uniform erosion even though the erosion is greater. For purposes of alignment, it is the uniformity of the marks which is important rather than the degree of erosion. Thus, with reference to FIG. 8 even though the segment 85 is in the region of deep erosion when compared to the area surrounding the dish, the region is uniformly eroded and thus provides good alignment qualities.

Figure 2:
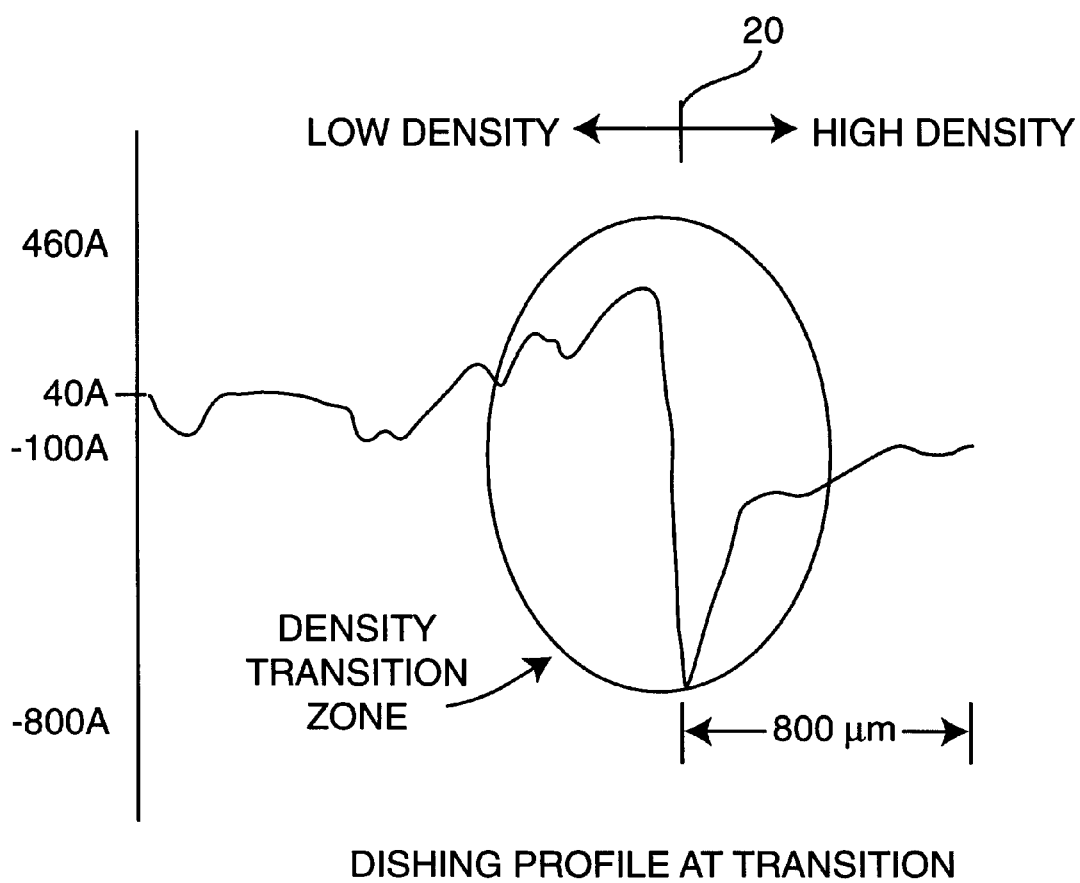
FIG. 2 is a graph illustrating the variation in feature heights without the present invention occurring following CMP at the transition between a low feature density area and a high feature density area.

The registration error was compared using the standard pair of marks shown in FIG. 2 with the twelve marks (two actual marks and ten dummy marks) of FIG. 4. The results showed an improvement of registration error with the present invention which would lead to a reduction in mean error of approximately 12%. Additionally, more alignment fields are sometimes used to compensate for the noisy signal resulting from distorted marks such as the alignment marks of FIG. 1. In one case, eighteen alignment fields per wafer are used during lithographic alignment to provide compensation for the noisy signal. With the present invention, the number of alignment fields was reduced to ten and even fewer may be used. This of course reduces alignment time, a critical consideration in integrated circuit fabrication.

Use of the Present Invention in Connection with Dishing at the Edges of Device Structures As discussed in conjunction with FIG. 2, nonuniform dishing occurs at the transition between the low density features and the high density features found in the die areas where the integrated circuits are fabricated. Typically in the die areas the features in an individual circuit structure are all fabricated with a somewhat uniform density determined by the critical dimension associated with the process. For example, for a 0.035 micron process, the circuit elements in the integrated circuit are for the most part all 0.035 microns wide. However, these circuit elements are not generally evenly distributed within the die, which results in areas with high and low feature density. With the present invention, dummy features are fabricated in the "open" low density areas providing approximately the same or greater feature density as exists in the adjacent denser device areas. For instance, assume that an integrated circuit is fabricated in the die area 70 of FIG. 7 with 0.035 micron technology. Arrays 71 of dummy features 72 are fabricated in an open or low density area of the wafer so that there is a zero or negative density gradient between the otherwise open area and the device area.

Figure 5:
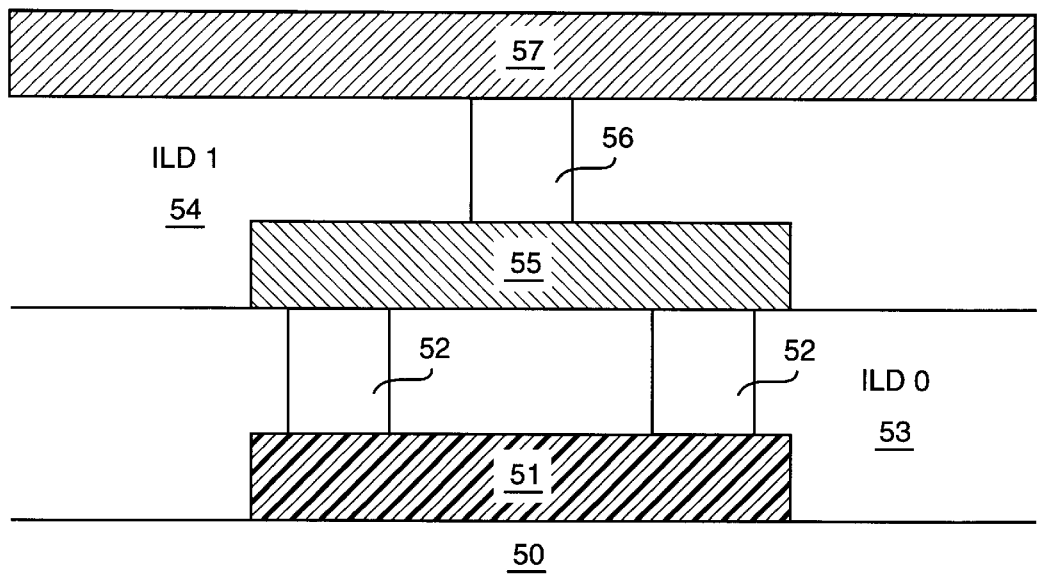
FIG. 5 is a cross-sectional elevation view of a dummy feature used in connection with the present invention.

One such dummy feature is illustrated in FIG. 5. This dummy feature is fabricated simultaneously with the fabrication of the integrated circuit in the high density areas of the wafer. By way of example, referring to FIG. 5, when polysilicon gates are formed on the wafer for the field-effect transistors in the die areas, dummy polysilicon gates 51 having similar dimensions as the actual gates used in the die areas are likewise fabricated in the arrays 71 of FIG. 7 for each of the dummy features 72. Similarly, when contacts to the gates are made through a zero layer ILD 53 formed over the entire wafer, dummy contacts 52 are fabricated for each of the dummy features in the array 71. With each layer, the arrays of dummy features 71 provide the sacrificial features for the CMP which in part are sacrificed to the excessive nonuniform dishing in the feature density transition zone to protect the features in the device areas.

This may continue for the entire process. As shown in FIG. 5, dummy metal lines 55, contact 56 disposed through a second level ILD and metal lines 57 may be fabricated in the arrays 71, again to provide sacrificial features for CMP processing as each layer is fabricated.

Figure 6:
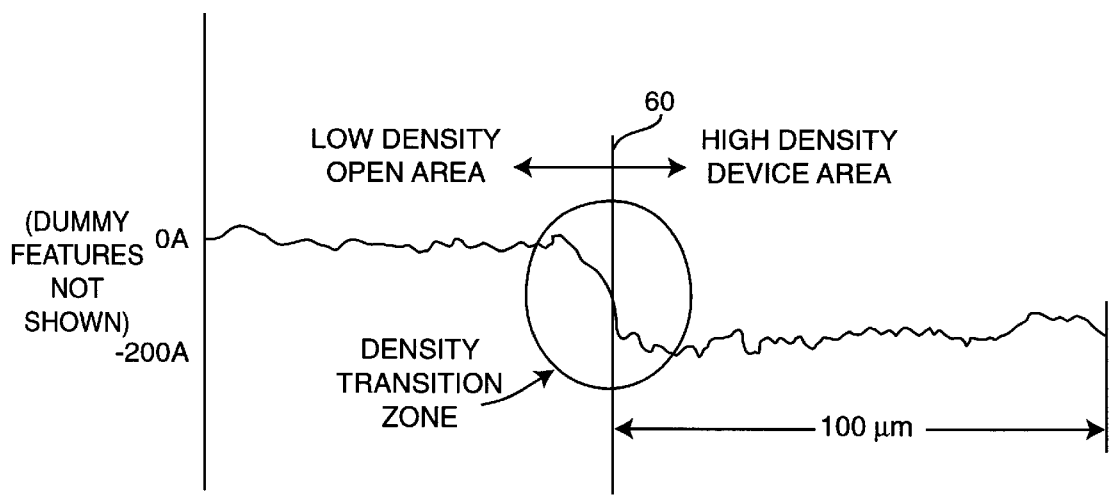
FIG. 6 is a graph illustrating the variation in feature heights following CMP with the improvement of the present invention at the transition between a low feature density area and a high feature density area.
Figure 7:
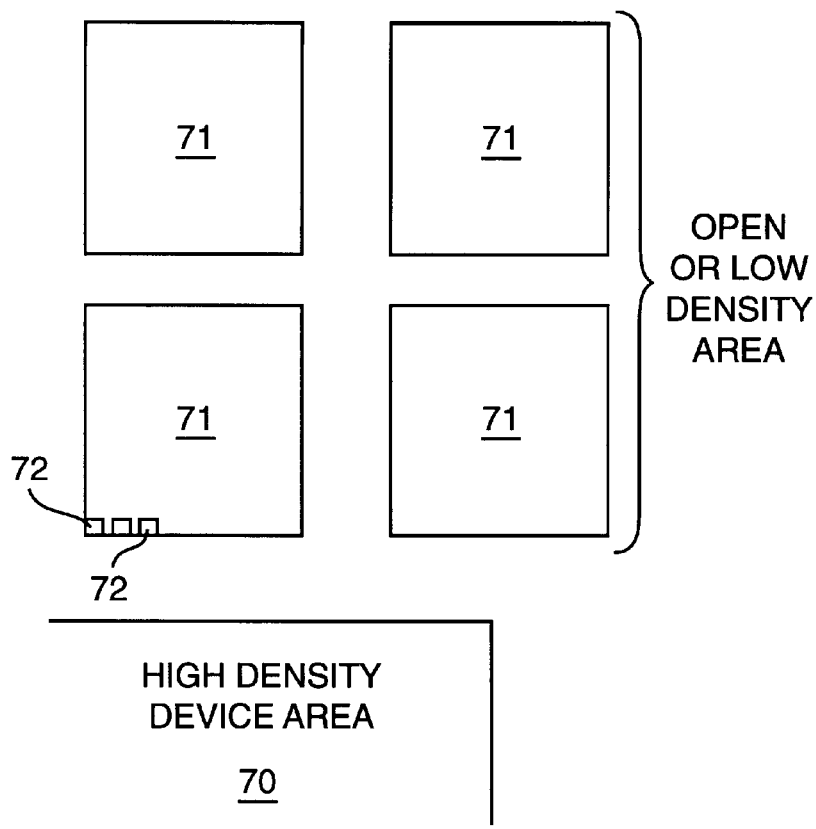
FIG. 7 is a plan view illustrating the use of the present invention in an open area of a wafer. This figure is used in connection with FIGS. 5 and 6.

The results of using the present invention as shown in FIGS. 5 and 7 has been measured and are illustrated in FIG. 6. Note that the dummy feature area is not shown, but is located to the left of the vertical axis. The proximity of the dummy area to the density transition to be protected, line 60 in FIG. 6, is a function of the CMP process and can be empirically determined or modeled. As can be seen, the erosion depth is relatively uniform in the device area within a few microns of the edge of the device area at the density transition zone. This is in contrast to the variation experienced without the present invention as shown at line 20 in FIG. 2. This is important since uniformity in erosion depth assures that a photo resist layer formed on the wafer will be entirely within the focal plane. If this does not occur, some of the features formed at the edge of the device area will be distorted.

Thus, with the present invention virtually none of the device area will have photoresist falling out of the focal plane of the masking steps when the dummy features are used in the surrounding open or low density areas.

Thus, sacrificial dummy features have been described which are useful in a CMP process for countering the effects of nonuniform or non-symmetric dishing. The present invention does not require any additional processing steps but rather fits into the process flow without changing that flow or without requiring additional masking steps.

What is claimed is:

1. A semiconductor wafer including:
    a plurality of parallel alignment markers in a scribe line region of the wafer comprising metal filled trenches having a predetermined pitch formed in a dielectric layer;
    a first plurality of parallel dummy markers comprising metal filled trenches having approximately the predetermined pitch formed in the dielectric layer adjacent to one side of the alignment markers; and
    a second plurality of parallel dummy markers comprising metal filled trenches having approximately the predetermined pitch formed in the dielectric layer adjacent to the other sides of the alignment markers.

2. The semiconductor wafer of claim 1 wherein the metal is tungsten.

3. The semiconductor wafer defined by claim 1 wherein the first and second plurality each comprise approximately five or more dummy marks.

\* \* \* \* \*